United States Patent
Manakli

(10) Patent No.: US 9,607,808 B2
(45) Date of Patent: Mar. 28, 2017

(54) METHOD OF ELECTRON-BEAM LITHOGRAPHY WITH CORRECTION OF CORNER ROUNDINGS

(75) Inventor: Serdar Manakli, Meyrie (FR)

(73) Assignee: Commissariat A L'Energie Atomique ET AUX Energies Alternatives, Paris (FR)

(*) Notice: Subject to any disclaimer, the term of this patent is extended or adjusted under 35 U.S.C. 154(b) by 725 days.

(21) Appl. No.: 13/641,120

(22) PCT Filed: Apr. 13, 2011

(86) PCT No.: PCT/EP2011/055746
§ 371 (c)(1),
(2), (4) Date: Nov. 14, 2012

(87) PCT Pub. No.: WO2011/128348
PCT Pub. Date: Oct. 20, 2011

(65) Prior Publication Data
US 2013/0181379 A1    Jul. 18, 2013

(30) Foreign Application Priority Data

Apr. 15, 2010 (FR) .................................... 10 52869

(51) Int. Cl.
*G03F 7/00* (2006.01)
*H01J 37/31* (2006.01)
(Continued)

(52) U.S. Cl.
CPC ............. *H01J 37/31* (2013.01); *B82Y 10/00* (2013.01); *B82Y 40/00* (2013.01); *G03F 1/78* (2013.01);
(Continued)

(58) Field of Classification Search
CPC ................................................. G03F 7/70425
(Continued)

(56) References Cited

U.S. PATENT DOCUMENTS

| 6,087,046 A | 7/2000 | Nakasuji |
| 6,107,207 A | 8/2000 | Waas et al. |

(Continued)

FOREIGN PATENT DOCUMENTS

| JP | 55-162228 | 12/1980 |
| JP | 61-043420 | 3/1986 |

(Continued)

OTHER PUBLICATIONS

JP Refusing Reason Notice issued Jan. 6, 2015 in JP Appl No. 2013-504248.

(Continued)

*Primary Examiner* — Christina Johnson
*Assistant Examiner* — Xue Liu
(74) *Attorney, Agent, or Firm* — Baker Hostetler LLP

(57) ABSTRACT

A method of electron-beam lithography by direct writing solves the reliability of design of etched components through rounding of the corners of contiguous patterns, notably in patterns to be etched of critical dimension of the order of 35 nm. The method determines critical patterns, and correction patterns by subtracting patterns of corrections of dimensions and of locations as a function of rounding of external or internal corners to be corrected and etching of the corrected design. The corrections may be by a correction model taking account of the parameters of the critical patterns. A correction of the proximity effects specific to these methods is also performed, by resizing of edges of blocks to be etched in combination optimized by the energy latitude with a modulation of the radiated doses. A rescaling and negation functions and eRIF functions may be used to optimize the parameters and the realization of the extrusion.

14 Claims, 12 Drawing Sheets

(51) Int. Cl.
  *B82Y 10/00* (2011.01)
  *B82Y 40/00* (2011.01)
  *G03F 1/78* (2012.01)
  *G03F 7/20* (2006.01)
  *H01J 37/317* (2006.01)

(52) U.S. Cl.
  CPC .......... *G03F 7/2061* (2013.01); *G03F 7/2063* (2013.01); *H01J 37/3174* (2013.01)

(58) Field of Classification Search
  USPC ........................................................ 264/485
  See application file for complete search history.

(56) References Cited

U.S. PATENT DOCUMENTS

| | | | |
|---|---|---|---|
| 6,361,911 B1* | 3/2002 | Tsai et al. .................. | 430/30 |
| 7,494,751 B2 | 2/2009 | Melvin, III et al. | |
| 2002/0177056 A1* | 11/2002 | Ogino et al. ................ | 430/30 |
| 2003/0203287 A1* | 10/2003 | Miyagawa ............. | B82Y 10/00 430/5 |
| 2006/0001688 A1 | 1/2006 | Chabreck et al. | |
| 2010/0058282 A1 | 3/2010 | Fujimura et al. | |
| 2010/0108640 A1 | 5/2010 | Nakada et al. | |

FOREIGN PATENT DOCUMENTS

| | | |
|---|---|---|
| JP | 2010-165446 | 7/2010 |
| WO | 2011/128393 A1 | 10/2011 |

OTHER PUBLICATIONS

S. Manakli, et al., "New Electron Beam Proximity Effects Correction Approach for 45 and 32 nm Nodes", Japanese Journal of Applied Physics, Part 1, Aug. 4, 2006, pp. 6462-6467, vol. 45, No. 8A, The Japan Society of Applied Physics, XP002613385.

Keisuke Tsudaka, et al., "Simulation-Based Automatic Optical Proximity Effect Correction Adaptive for Device Fabrication", Japanese Journal of Applied Physics, Dec. 1997, pp. 7477-7481, vol. 36, Part 1, No. 12B.

Keeho Kim, et al., "Optical Proximity Correction Methodology to Counteract Mask Error Effects in Sub-0.25 um Lithography Generations", Japanese Journal of Applied Physics, Dec. 1998, pp. 6681-6685, vol. 37, Part 1, No. 12B.

\* cited by examiner

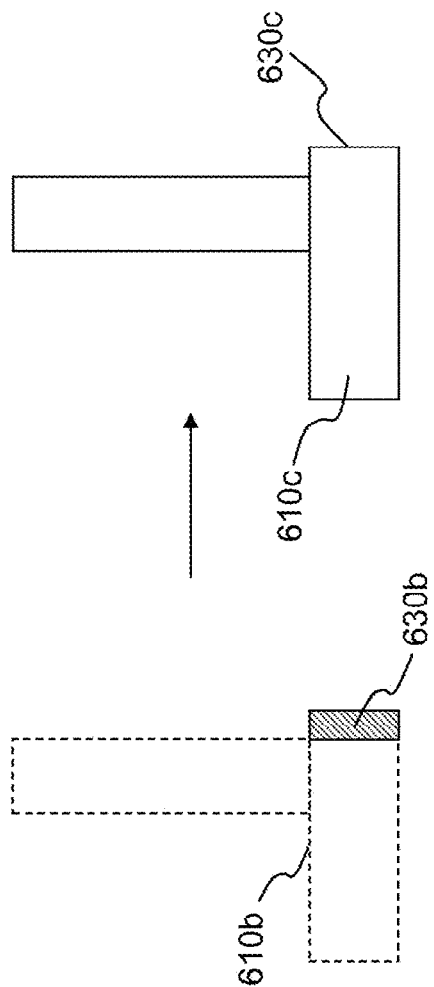

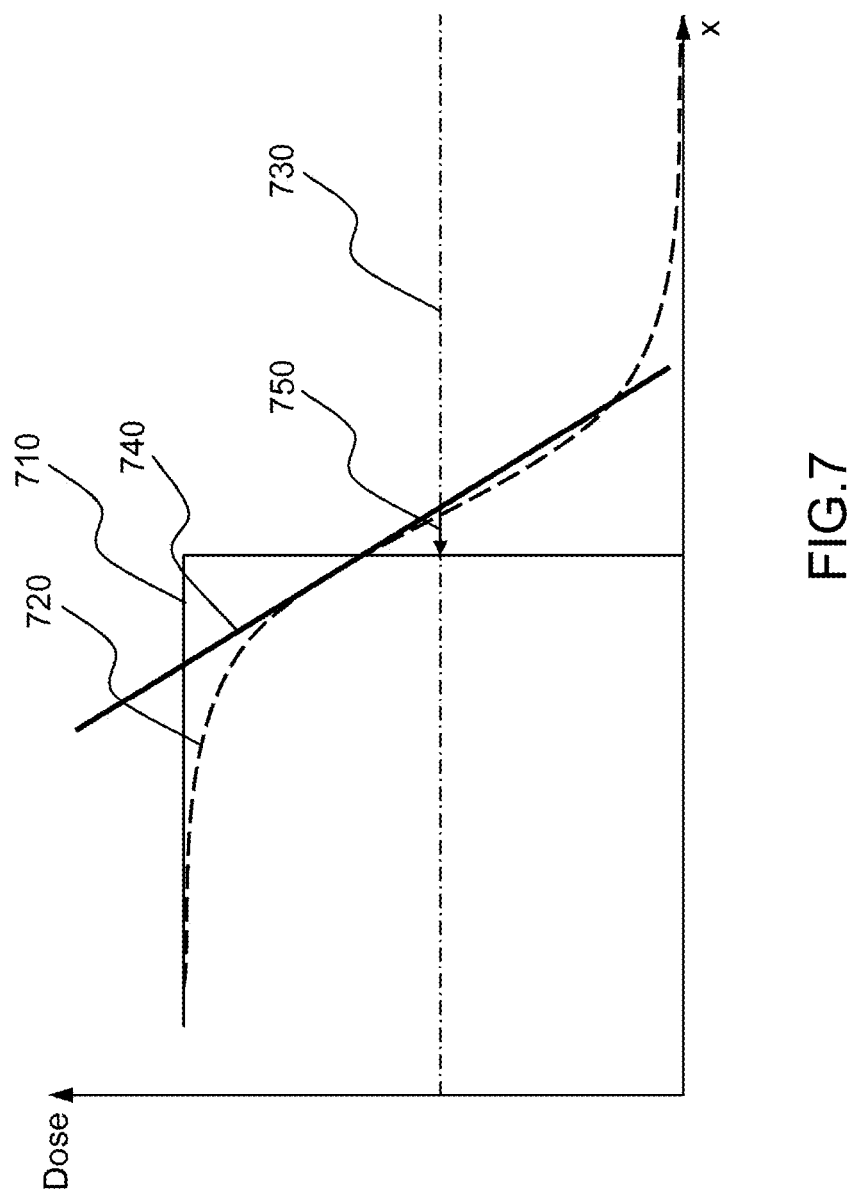

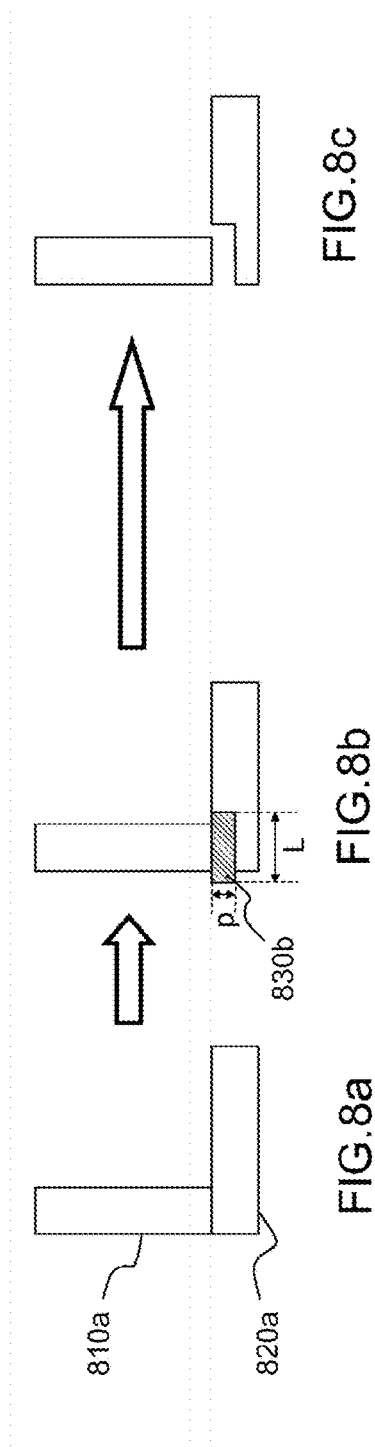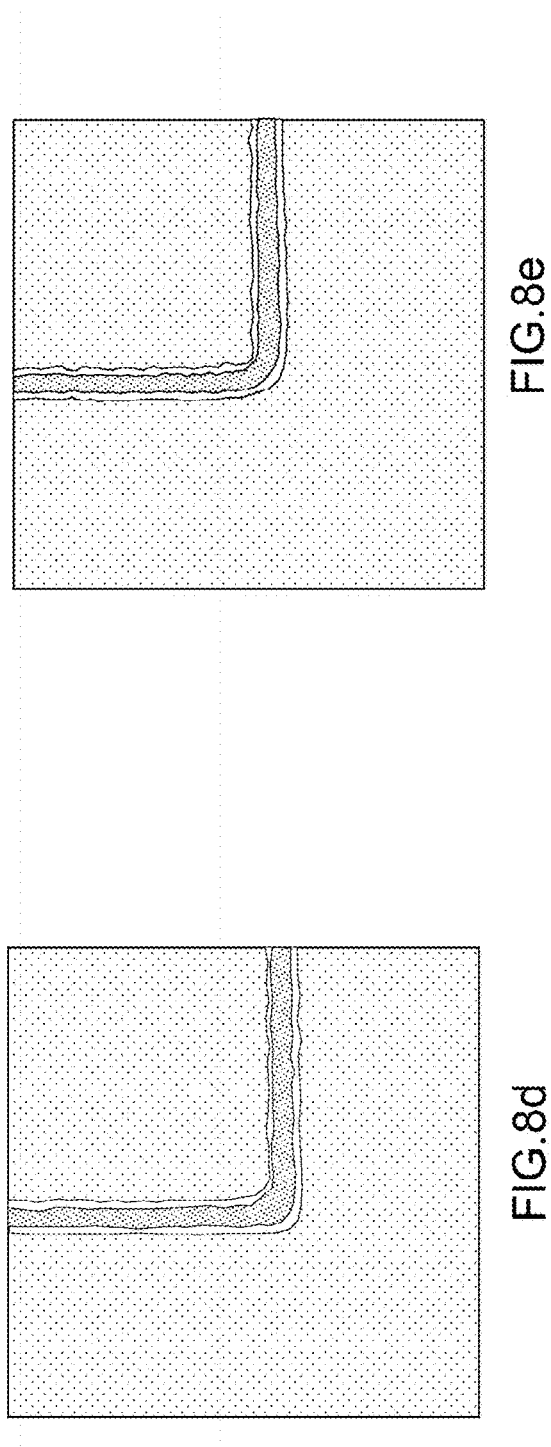

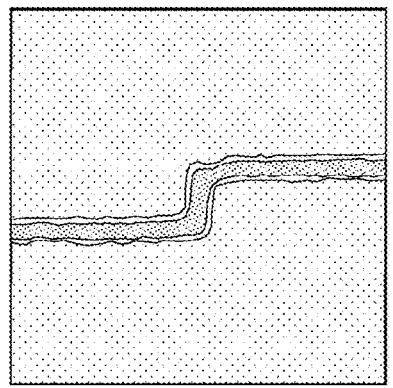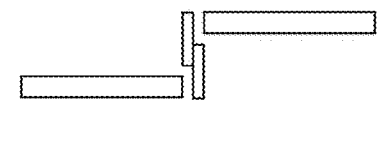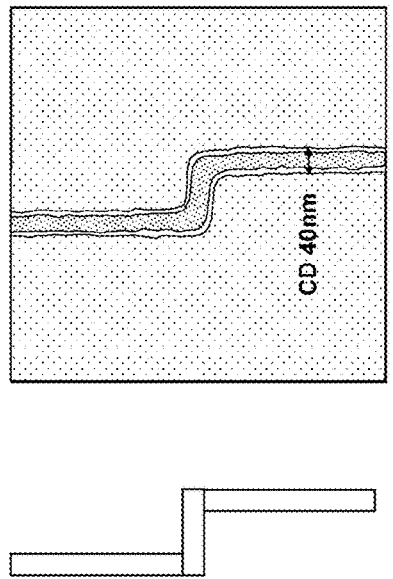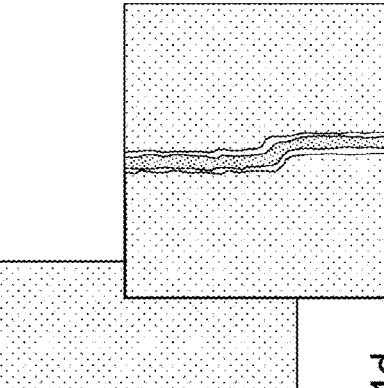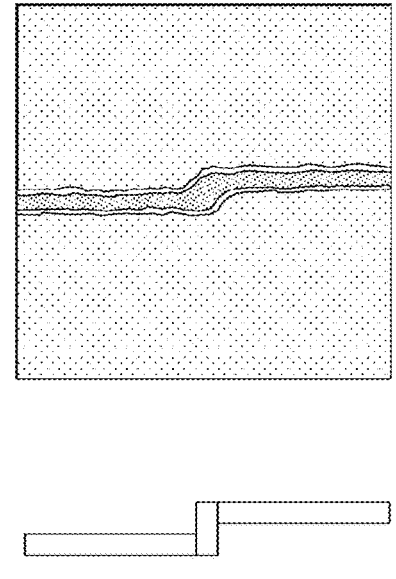

METHOD OF ELECTRON-BEAM LITHOGRAPHY WITH CORRECTION OF CORNER ROUNDINGS

CROSS-REFERENCE TO RELATED APPLICATIONS

This application is a National Stage of International patent application PCT/EP2011/055746, filed on Apr. 13, 2011, which claims priority to foreign French patent application No. FR 1052869, filed on Apr. 15, 2010, the disclosures of which are incorporated by reference in their entirety.

BACKGROUND

The present invention applies to the domain of electron-beam lithography. To allow the etching of patterns whose critical dimension is below 50 nm, it is necessary to integrate into the methods of optical photolithography schemes for correcting optical distortions that are increasingly complex both at the mask design and production stage and at the exposure stage. The costs of equipment and developments for a new generation of technology consequently increase in very high proportions. Today, the critical dimensions accessible in photolithography are greater than or equal to 65 nm. The 32-45 nm generation is undergoing development and there is no viable solution envisaged for technological nodes below 22 nm. For its part, electron-beam lithography already allows the etching of 22-nm patterns; it does not require any mask and offers a fairly short development time, thus allowing better reactivity and flexibility in the realization of improvements to the technologies and to the designs. On the other hand, the production times are structurally substantially higher than in photolithography since it is necessary to carry out step-by-step exposure, whereas photolithography requires only layer-wise exposure.

The electron beam or beams used to perform the etching of a pattern scatter notably over short distance (forward scattering or blur) in the resin and the substrate on the edges of the center of the beam, thus increasing the size of the beam and reducing its contrast. Moreover, the electrons are completely backscattered over a long distance (backward scattering). This proximity effect is particularly sensitive to the angles of the patterns to be etched or corners which are rounded. This effect reduces the precision of the etching, affects the functionality of the components and is liable to decrease integrated circuit production yields.

A certain number of prior art methods, in the domains of photolithography and electron-beam lithography, have attempted to make corrections to this phenomenon of corner rounding. Such is notably the case in photolithography of the methods providing for the modification of the patterns to be etched, notably by extension of their surface at the end of the line, such as those disclosed by K. Tsudaka et al., Japanese Journal of Applied Physics, Vol. 36 (1997), pp. 7477-7481, K. Kim et al., Japanese Journal of Applied Physics, Vol. 37 (1998), pp. 6681-6685 as well as by U.S. Pat. No. 7,494,751.

In electron-beam lithography, some methods are aimed at globally reducing the proximity effects, without addressing the specific problem of the rounding of the corners of the patterns to be etched. Such is notably the case for the scheme described in U.S. Pat. No. 6,107,207, which carries out a correction of the proximity effects by increasing the radiation doses at the pattern edge. This increase in dose is manifested by a new increase in the exposure times, thus constituting a very significant handicap for the industrial rollout of this technology.

SUMMARY OF THE INVENTION

The objective and the result of the present invention are to solve the problem posed by the rounding of the corners of the patterns in a manner suited to the methods of electron-beam lithography, notably for technologies of the order of 22 nm, without involving any appreciable increase in the radiated doses.

For this purpose, the invention provides for a method of electron-beam lithography of networks of patterns on a resin-coated substrate comprising at least two perpendicular patterns positioned in a contiguous manner, characterized in that it comprises a step of determining said contiguous patterns, a step of generating at least one correction pattern, a step of determining a non-exposure zone of the resin cutting through at least one of said two contiguous patterns around their common edge and a step of combining said correction pattern with said contiguous patterns.

Advantageously, the critical dimension of the network of patterns is of the order of 35 nm and said non-exposure zone of the resin produces a spacing between said two contiguous patterns of the order of 10 nm.

Advantageously, said correction pattern determines an exposure zone of the resin added in a contiguous manner to at least one of said two contiguous patterns.

Advantageously, the critical dimension of the network of patterns is of the order of 35 nm, and said exposure zone of the resin produces a lengthening of said at least one of the two contiguous patterns in its larger dimension of the order of 5 nm.

Advantageously, said correction patterns, their dimensions and their locations are determined by a model for automatically determining a target design comprising the contiguous patterns and the correction patterns.

Advantageously, the method of the invention furthermore comprises at least one step of calculating at least one dimension of at least one of the contiguous patterns and a step of calculating modulation of doses on said patterns, said calculations being linked by a functional relation involving the process energy latitude or the position of the edges of the patterns.

Advantageously, the step of combining said correction pattern with said contiguous patterns uses a function for negative rescaling of the non-exposure zone.

Advantageously, the step of generating at least one correction pattern uses an eRIF function.

To implement the method, the invention also provides for a computer program comprising program code instructions configured to execute a method of electron-beam lithography of networks of patterns on a resined substrate comprising at least two perpendicular patterns positioned in a contiguous manner according to the method of the invention, when the program is executed on a computer, said computer program being characterized in that it comprises a module for determining said contiguous patterns, a module for generating at least one correction pattern, a module for determining a non-exposure zone of the resin cutting through at least one of said two contiguous patterns around their common edge and a module for combining said correction pattern with said contiguous patterns.

Advantageously, the program of the invention furthermore comprises a module for applying a model for automatically determining a target design comprising the contiguous patterns and the correction patterns whose dimensions and locations are determined by said model.

Advantageously, the program of the invention furthermore comprises at least one module for calculating at least one dimension of at least one of the contiguous patterns and a module for calculating modulation of doses on said patterns, said calculations being linked by a functional relation involving the process energy latitude.

In a particularly advantageous embodiment, the invention is combined with a specific mode of modulation of the radiated doses, coupled with a resizing of the patterns by optimizing the process energy latitude, thereby allowing a limitation of the losses of linearity for the technology methods of critical dimension below 70 nm, the increase in the IDB (Isolated Dense Bias i.e. difference between the critical dimensions for isolated and dense structures), of the increase in the shortening of the line ends (Line End Shortening or "LES"), and of the reduction in the energy latitude (EL), all effects which occur when these prior art dose modulation schemes are applied. These defects of proximity effect correction schemes such as those described in U.S. Pat. No. 6,107,207 have been set forth notably in the publication by S. Manakli, "New Electron Beam Proximity Effect Correction Approach for 45 and 32 nm Nodes", Japanese Journal of Applied Physics, Vol. 45, No. 8A, pp. 6462-6467.

Furthermore, having regard to the procedures for calculating the corrections, automation of the correction calculations in a manner integrated into computer-aided design tools is achievable, thereby affording the inestimable advantage of offering users of the system and of the method according to the invention a conversion of their libraries of standard components at reduced cost.

BRIEF DESCRIPTION OF THE DRAWINGS

The invention will be better understood, its various characteristics and advantages will emerge from the description which follows of several exemplary embodiments and of its appended figures wherein:

FIGS. 6a, 6b and 6c represent respectively a pattern with corners to be etched, the application of a correction of the rounding of an exterior corner and the effect of the application of this correction in an embodiment of the invention;

FIG. 7 illustrates the method of resizing the edges of the block to be etched according to a variant of the invention;

FIGS. 8a, 8b, 8c, 8d and 8e illustrate the application of an extrusion technique using a function for negative rescaling in an embodiment of the invention;

FIGS. 13a, 13b, 13c and 13d illustrate an exemplary embodiment of the invention of a technique of extrusion of a correction pattern by comparison with a realization of the exposure without extrusion, for a fourth particular type of pattern to be etched;

FIGS. 14a, 14b, 14c and 14d illustrate an exemplary embodiment of the invention of a technique of extrusion of a correction pattern by comparison with a realization of the exposure without extrusion, for a fifth particular type of pattern to be etched;

DETAILED DESCRIPTION

Figure 1:
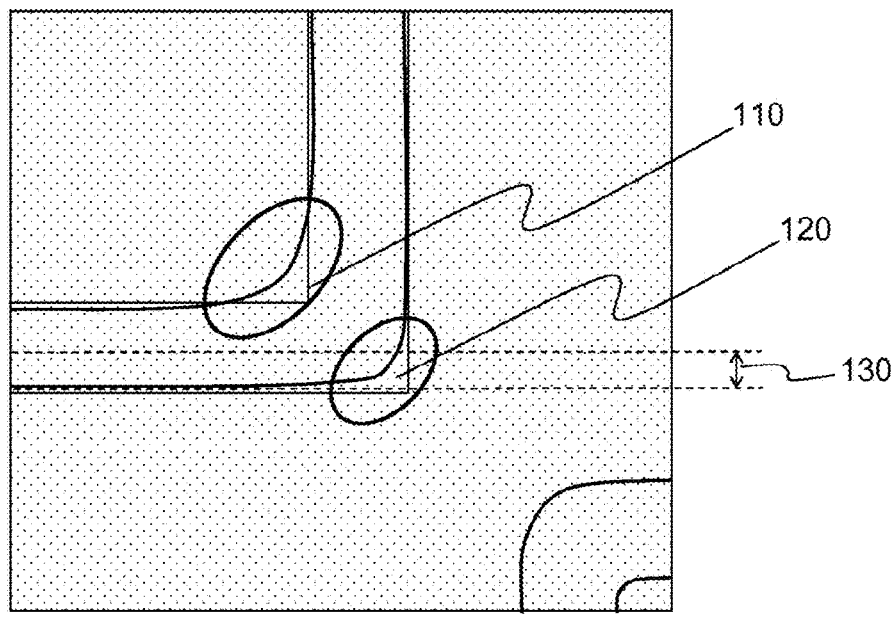
FIG. 1 illustrates the effect of rounding of corners of the patterns to be etched without application of the correction method of the invention.

FIG. 1 illustrates the effect of rounding of corners of the patterns to be etched without application of the correction method of the invention.

This is a view of an etching performed by a method of electron-beam lithography using a dose modulation method of the prior art.

As seen in the figure, the two corners 110, 120 are rounded in a fairly appreciable manner since the radius of curvature of the rounding, 130, is approximately equal to half a pattern width.

The rounding of the corners or Corner Rounding, will be designated hereinafter by the initials CR. A distinction will be made between Inner CR or ICR, 110, or interior corner rounding, and Outer CR or OCR, 120, or exterior corner rounding.

Figure 2:
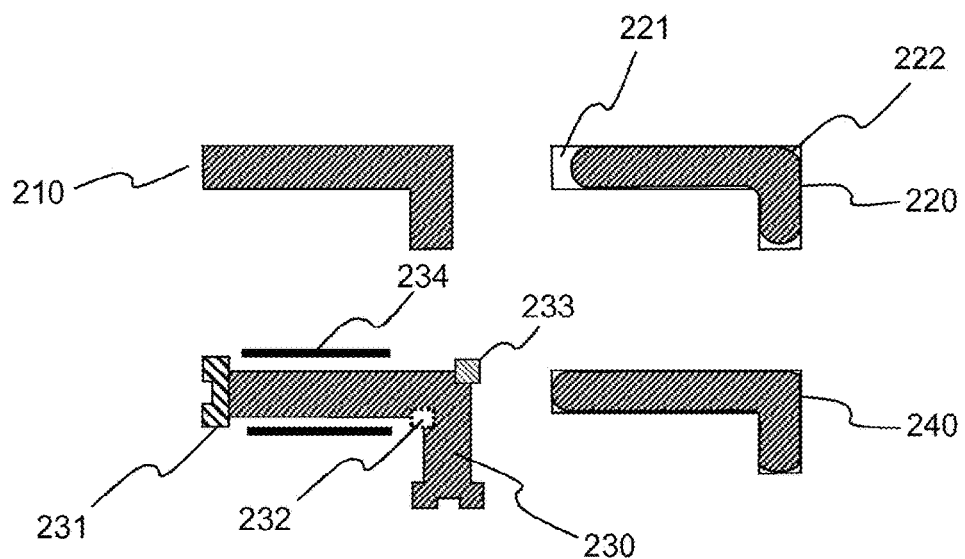
FIG. 2 represents a view of a pattern to be reproduced and of a reproduced pattern, without correction of the corner roundings and with correction of the corner roundings in a photolithography method of the prior art.

The modulation of doses may be combined with the inclusion of serigraphic patterns as in a photolithography method, such as illustrated in FIG. 2. The methods of this type exhibit notably the drawback of not allowing complete correction of the roundings, in particular inside the L of the pattern to be etched (ICR, 110), since the method of correction by addition of serigraphic patterns is particularly difficult to master. Furthermore, dose modulation involves a significant increase in the number of shots and exposure times. Now, the ICRs are considered to be particularly critical by the design rules of most methods, notably on the active layers. It is important in particular to be able to completely remove the ICRs above 20 nm. The method of the invention makes it possible to attain this result, as illustrated further on in the description.

FIG. 2 represents a view of a pattern to be reproduced and of a reproduced pattern, without correction of the corner roundings and with correction of the corner roundings in a photolithography method of the prior art.

The pattern 210 to be reproduced is transferred into the resin in the form of a deformed image 220. In particular, this image comprises a line end shortening (LES), 221 and corner roundings (CR) such as 222, on account of the contrast reduction effect at the extremities of the pattern.

The pattern 230 to be reproduced is modified by addition of sub-resolved patterns such as a "hammerhead", 231, a "serif", 233, or one or more scattering bars, 234. The pattern can also be a subtraction of material such as a "mousebite", 232. The impact of a light ray shaped in a particular manner (a single central beam, dipolar beam, qua dripolar beam or annular beam) with these sub-resolved patterns creates a diffraction effect which restores the contrast and transfers the pattern modified by these additions and subtractions into the resin with an image, 240, identical to the initial pattern before additions/subtractions.

FIGS. 3a, 3b, 3c and 3d represent respectively in a schematic manner a pattern with corners to be etched, the application of radiated doses without corrections, the result of said application without correction and the result of the application of corrections in an embodiment of the invention.

Figure 3D:
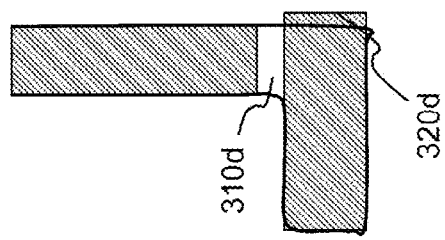
FIGS. 3a, 3b, 3c and 3d represent respectively in a schematic manner a pattern with corners to be etched, the application of radiated doses without corrections, the result of said application without correction and the result of the application of corrections in an embodiment of the invention.
Figure 3C:
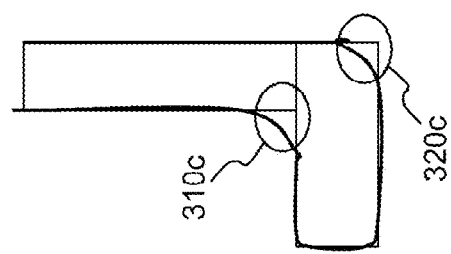
Figure 3B:
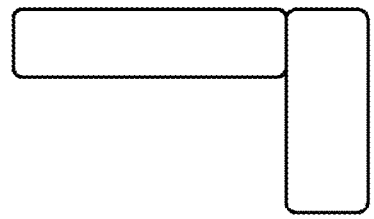
Figure 3A:
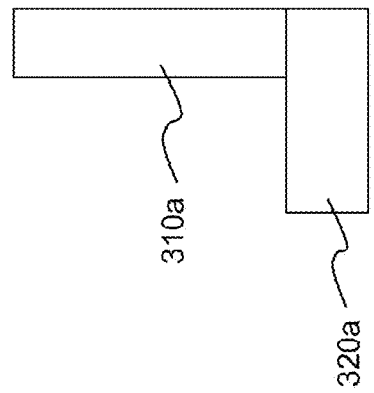

FIG. 3a represents two perpendicular contiguous patterns, 310a and 320a, to be reproduced.

FIG. 3b represents the same two contiguous patterns to be reproduced without specific correction.

FIG. 3c represents the etching of the two perpendicular contiguous patterns on the resin coated substrate by using a method of the prior art. The ICR, 310c, the OCR, 320c, are apparent in the figure, in a manner identical to FIG. 1.

FIG. 3d represents the result of the application of the method of the invention to etch the pattern of FIG. 3a, by applying corrections whose procedures will be explained further on in the description. In summary, for patterns whose critical dimension is of the order of 35 nm, the method consists, in order to correct the ICR, in inserting a non-exposure zone or aperture, 310d, which separates the two contiguous patterns, 310a and 320a, by a distance of the order of 10 nm, and, in order to correct the OCR, in lengthening the pattern 320a by an additional exposure zone or extension toward the exterior, 320d, of a length according to the largest dimension of the pattern 320a of the order of 5 nm.

The non-exposure zone and additional exposure zone, 310d and 320d, may be inserted by applying rules programmed for this purpose. Said rules can also be included in a model for generating a corrected design taking into account the patterns to be etched as well as the zones corresponding to patterns to be subtracted or to be added in order to carry out the corrections necessary to remove the CRs.

Figure 4:
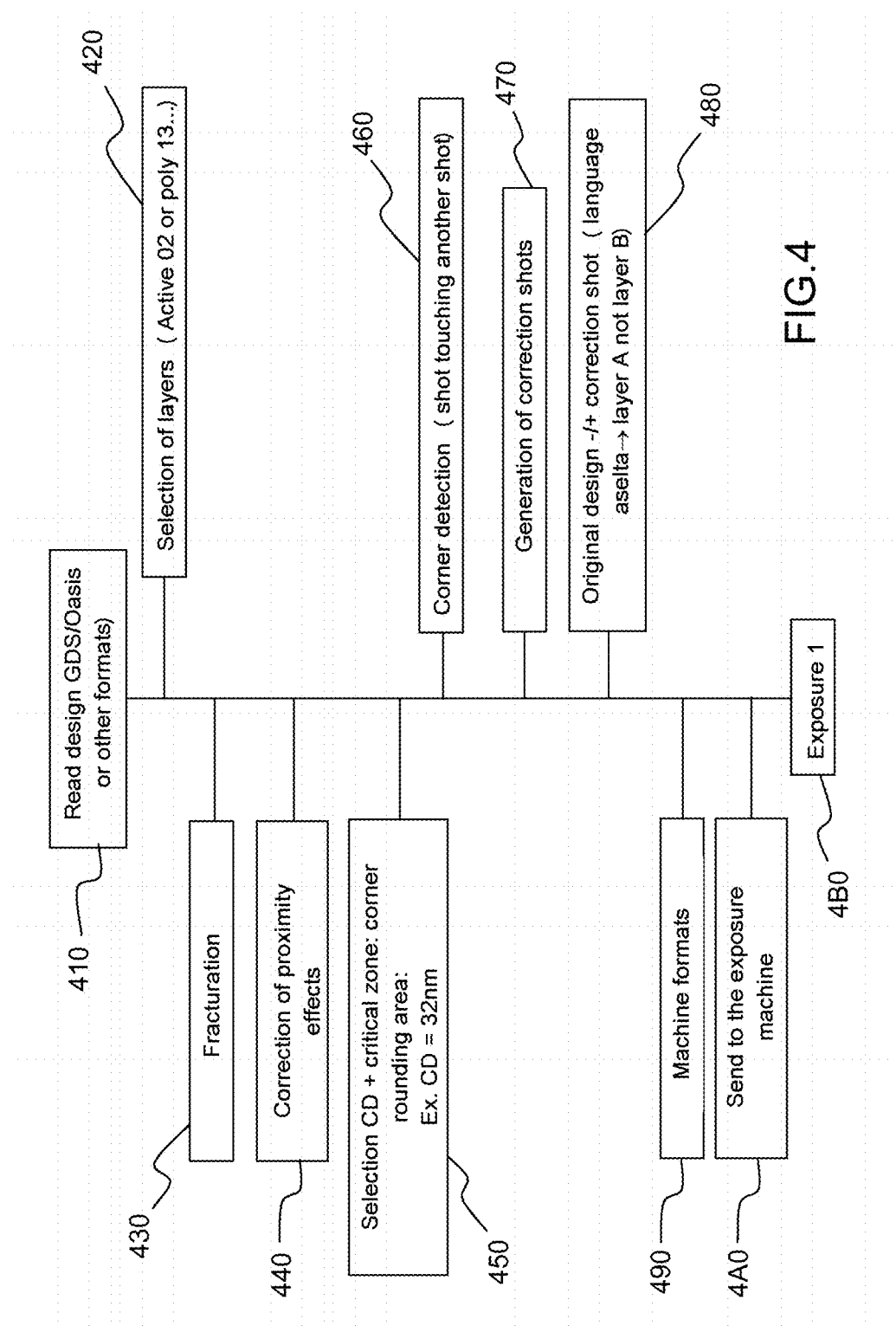
FIG. 4 represents the flowchart of a method for correcting the corner roundings in an embodiment of the invention.

FIG. 4 represents the flowchart of a method for correcting the corner roundings in an embodiment of the invention.

In a conventional manner for a person skilled in the art, the method of the invention begins with a step, 410, of reading the design. The lay-out of the patterns to be etched is conventionally encoded in files in the GDS II (Graphic Data System version2) or OASIS (Open Artwork System Interchange Standard) format. The machine and the software used are for example a machine with the VISTEC™ or ADVANTEST™ brand name. Its drive software is adapted so as to be able to implement the various steps described hereinabove.

The layers where the patterns must be etched are thereafter selected in the course of a step 420.

A fracturation step, 430, is carried out thereafter, in the course of which the patterns to be etched are split into zones which will be exposed by a shot. Said shot will have a radiation dose determined by the exposure program.

In the course of a step 440, a correction of the proximity effects is carried out either by dose modulation, as a function of the positioning of the pattern to be etched with respect to the edges of the general pattern, or by applying a variant of the invention which comprises a resizing of the pattern, said variant being explained further on in the description as a commentary to FIG. 7.

In the course of a step 450, the critical zones are identified, that is to say those comprising perpendicular contiguous patterns to be etched that are liable to generate CRs. This selection step depends on the critical dimension of the method applied to the network of patterns.

In the course of a step 460, the CRs are detected in the zones which were identified in the course of the previous step.

The correction shots are generated thereafter, in the course of a step 470, according to rules which will be detailed further on as a commentary to FIGS. 5 and 6. This generation step will be different depending on whether an ICR or an OCR is corrected. In the first case, a non-exposure zone is generated between the two perpendicular contiguous patterns. In the second case, an exposure zone is generated which lengthens one of the perpendicular contiguous patterns to be etched.

In the course of a step 480, the design comprising the original patterns and the correction patterns is produced thereafter.

In the course of steps 490, 4A0 and 4B0, the commands for the electron-beam lithography machine are finalized by converting the instructions generated in the course of the previous steps into machine format, by sending them to said machine, and then by carrying out the exposure.

Figure 5A:
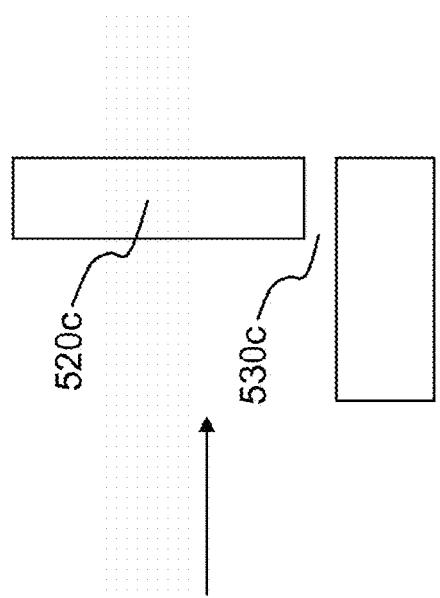
FIGS. 5a, 5b and 5c represent respectively a pattern with corners to be etched, the application of a correction of the rounding of an interior corner and the effect of the application of this correction in an embodiment of the invention.
Figure 5B:
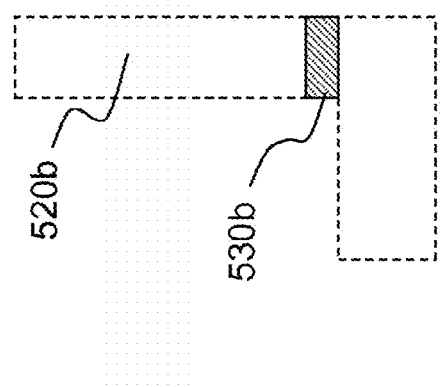
Figure 5C:
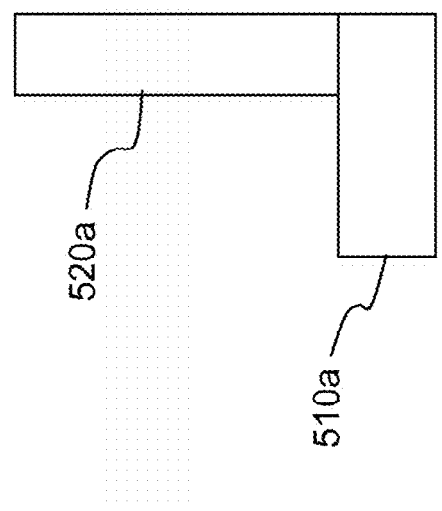

FIGS. 5a, 5b and 5c represent respectively a pattern with corners to be etched, the application of a correction of the rounding of an interior corner and the effect of the application of this correction in an embodiment of the invention.

FIG. 5a represents two perpendicular contiguous patterns, 510a and 520a. In a particular embodiment of the invention, these two patterns have a critical dimension of the order of 35 nm.

FIG. 5b represents the same two perpendicular contiguous patterns, as well as a correction pattern for the expected ICR, 530b. Said correction pattern is intended not to be etched and therefore constitutes a subtraction from the pattern to be etched 520a in order to carry out said correction. This pattern will be implanted between the two contiguous patterns and will have the same width as said pattern 520a, having become 520b. Its dimension in the direction of the largest dimension of the pattern 520a will be calculated in step 470 of the method illustrated by FIG. 4. This dimension will be of the order of 10 nm, in the exemplary embodiment where the critical dimension of the pattern 520a is of the order of 35 nm.

FIG. 5c represents the result of the etching of the design comprising the two original patterns to be etched, respectively 510a, 520a, the second becoming, after carrying out the etching, 520c, of a length reduced substantially by the dimension of the correction pattern, 530c.

FIGS. 6a, 6b and 6c represent respectively a pattern with corners to be etched, the application of a correction of the rounding of an exterior corner and the effect of the application of this correction in an embodiment of the invention.

FIG. 6a represents two perpendicular contiguous patterns, 610a and 620a. In a particular embodiment of the invention, these two patterns have a critical dimension of the order of 35 nm.

FIG. 6b represents the same two perpendicular contiguous patterns, as well as a correction pattern for the expected OCR, 630b. Said correction pattern is intended to be etched and therefore constitutes an addition to the pattern to be etched 610a in order to carry out said correction. This pattern will be implanted so as to carry out a lengthening of one of the two contiguous patterns (in the case represented by the figure, of the pattern 610a) and will have the same width as said pattern 610a, having become 610b. Its dimension in the direction of the largest dimension of the pattern 610a will be calculated in step 470 of the method illustrated by FIG. 4. This dimension will be of the order of 5 nm, when the critical dimension of the pattern 610a is of the order of 35 nm.

FIG. 6c represents the result of the etching of the design comprising the two original patterns to be etched, respectively 610a, 620a, the first becoming, after carrying out the etching, 610c, of a length increased substantially by the dimension of the correction pattern, 630c.

By way of variant embodiment, it is possible to perform, in the course of a step 440, a resizing of the target design by using the method of combined optimization of the geometry of the CIF and of the lines and of the modulation of dose radiated according to the method disclosed by the patent application filed by the applicant of the present application under the number 1052862.

According to the method described by this patent application, which is aimed at a correction of the proximity effects inherent in lithography methods for geometries of less than 50 nm, the doses to be applied in the shots corresponding to the patterns to be added/deducted from the initial patterns are calculated either by convolving the radiated dose with the pattern to be etched or by using a table of parameters. The combined calculation of the modulation of dose to be applied and of the size of the new patterns is performed so as to preserve the process energy latitude according to a calculation, an example of which is given hereinbelow as a commentary to FIG. 7.

FIG. 7 illustrates the method of resizing of the geometries to be etched according to a variant of the invention.

The geometry of the patterns is modified in at least one dimension so as to optimize the process energy latitude More precisely, the displacement 750 to be performed along this dimension is calculated by seeking the intersection of the straight line 740 (tangent to the curve of dose received, 720, at the point where the dose received is equal to the sensitivity threshold of the resin at 0.5) with the straight line 730 which demarcates said sensitivity threshold, and then by performing the displacement toward the point of intersection of the latter straight line with the profile of the radiated dose 710.

The dose/patterns combined calculation may be iterated two or three times.

The modulation of the dose to be applied to the patterns can also be calculated on the basis of a table of parameters without any convolution calculation, notably when the modulation is applied only to the shots outside the patterns, the other shots being applied at the normalized value of the method, or at a value of the order of 30% smaller than the latter.

FIGS. 8a, 8b, 8c, 8d and 8e illustrate the application of an extrusion technique using a function for negative rescaling in an embodiment of the invention.

According to a favored embodiment of the invention, for a pattern represented in FIG. 8a, consisting of two perpendiculars, 810a, 820a, a correction pattern consisting of an extrusion, 830b, is created in at least one of the perpendicular patterns, 820a, to be etched.

The dimensions of the extrusion p, L, are determined in the step of generating the correction pattern. The extrusion can for example be carried out with the aid of functions present in the library of the tool. A pattern for extending the line 810a of width L and of height p is firstly generated. Next, with the aid of a boolean function minus ( ) between 820a and 830b, the extrusion is generated, A function for negative rescaling (for example, Inscale minus ( ) in the library of functions of the tool The design which will be projected is represented in FIG. 8c.

The difference in the CD is noted in FIGS. 8d and 8e: in the case where the projection of the original pattern is performed without correction, the CD is widened at the corner of the two perpendicular patterns (FIG. 8d); in the case where the correction is applied by extrusion according to the method of the invention, in one of its embodiments, the CD is constant throughout the etched line.

Figure 9B:
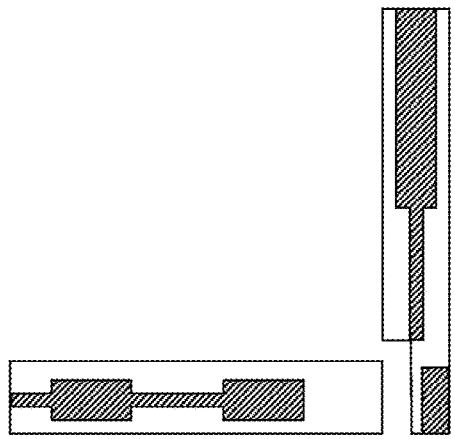
FIGS. 9a and 9b illustrate the application of a technique for generating the correction patterns using an eRIF function in an embodiment of the invention.
Figure 9A:
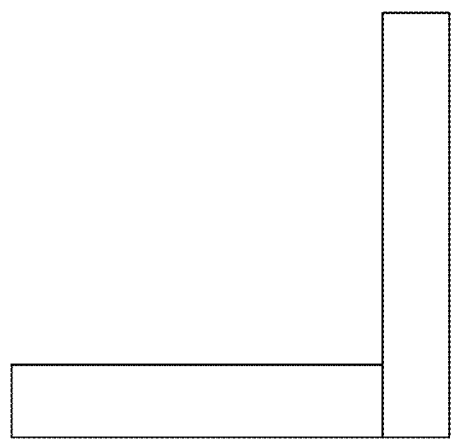
Figure 10A:
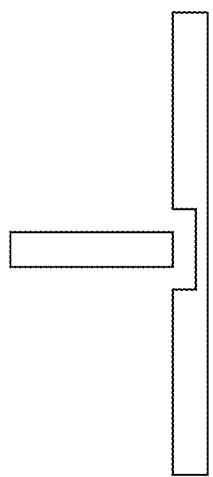
FIGS. 10a, 10b, 10c and 10d illustrate an exemplary embodiment of the invention of a technique of extrusion of a correction pattern by comparison with a realization of the exposure without extrusion, for a first particular type of pattern to be etched.
Figure 10B:
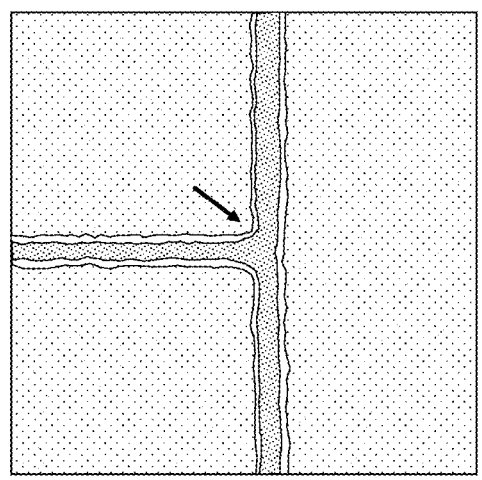
Figure 10C:
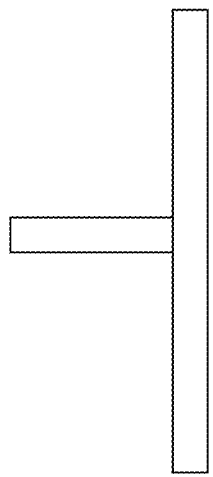
Figure 10D:
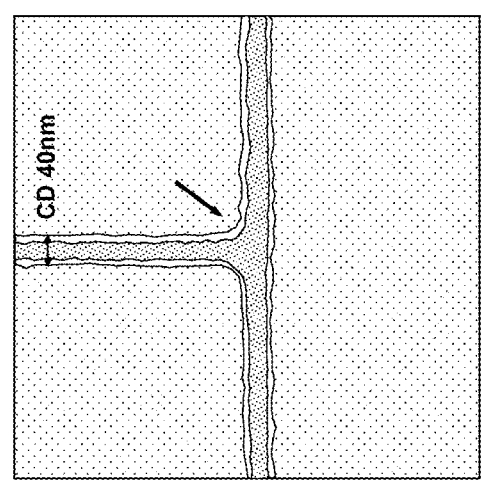
Figure 11B:
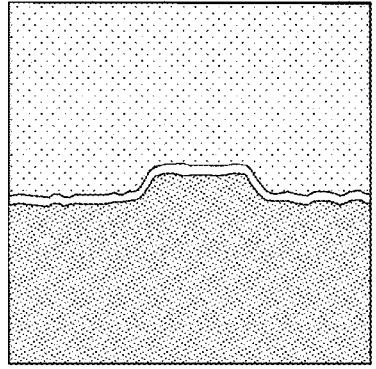
FIGS. 11a, 11b, 11c and 11d illustrate an exemplary embodiment of the invention of a technique of extrusion of a correction pattern by comparison with a realization of the exposure without extrusion, for a second particular type of pattern to be etched.
Figure 11A:
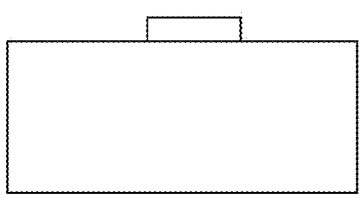
Figure 11D:
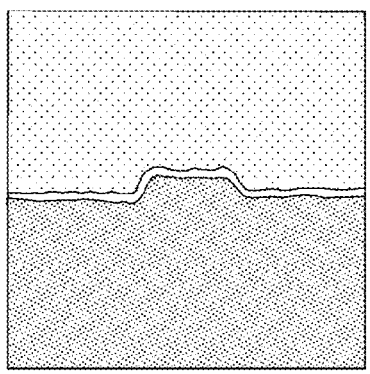
Figure 11C:
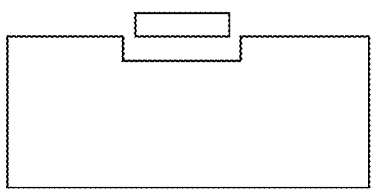
Figure 12B:
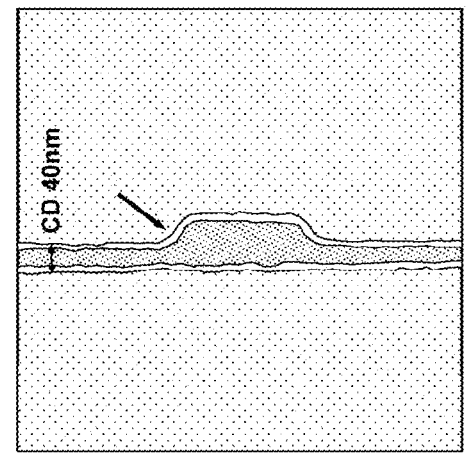
FIGS. 12a, 12b, 12c and 12d illustrate an exemplary embodiment of the invention of a technique of extrusion of a correction pattern by comparison with a realization of the exposure without extrusion, for a third particular type of pattern to be etched.
Figure 12A:
Figure 12D:
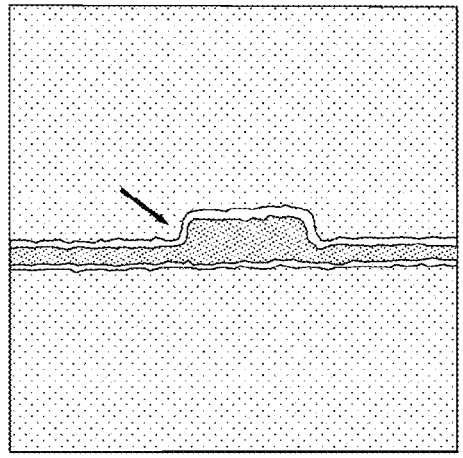
Figure 12C:
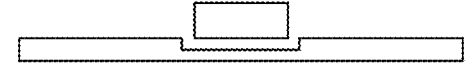

FIGS. 9a and 9b illustrate the application of a technique for generating the correction patterns using an eRIF function in an embodiment of the invention.

An eRIF (for electron Resolution Improvement Feature) is an extra pattern of smaller dimension than the pattern to be printed which makes it possible to improve the method resolution or latitude. Its size and its position may be adjusted with this aim. For the irradiation tools which allow multiple exposure, they are in general superimposed with the original pattern. In FIG. 9b, the extrusion described hereinabove is combined with an eRIF function.

FIGS. 10a to 16d illustrate several exemplary embodiments of the invention of a technique of extrusion of a correction pattern as compared with carrying out the exposure without extrusion, for several particular types of patterns to be etched, The figures indexed with an "a" illustrate the pattern to be etched. The figures indexed with a "b" illustrate the result of an etching of this pattern without applying the corrections according to the invention. The figures indexed with a "c" illustrate the pattern actually projected after applying the extrusion according to the invention. The figures indexed with a "d" illustrate the result of the etching of the pattern corrected by the extrusion according to the method of the invention.

The various cases are distinguished by the respective size of the perpendicular patterns, their geometries, which may comprise more than two segments, as in the cases of FIGS. 13a to d and 14a to 14d, the carrying out of discontinuous extrusions (two in the case of FIG. 13c), the geometry of the extrusions carried out, which may be complex, as in the case of FIG. 14c.

In all cases, the fracturation carried out is not modified, thereby constituting an advantage of the invention.

Figure 15D:
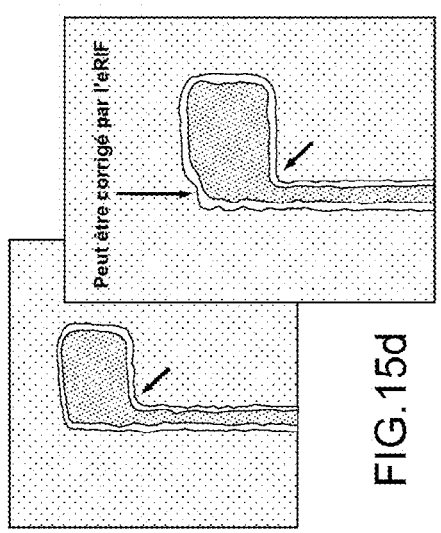
FIGS. 15a, 15b, 15c and 15d illustrate an exemplary embodiment of the invention of a technique of extrusion of a correction pattern by comparison with a realization of the exposure without extrusion, for a sixth particular type of pattern to be etched.
Figure 15C:
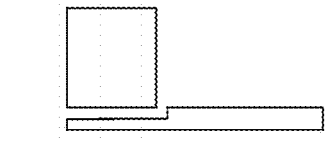
Figure 15B:
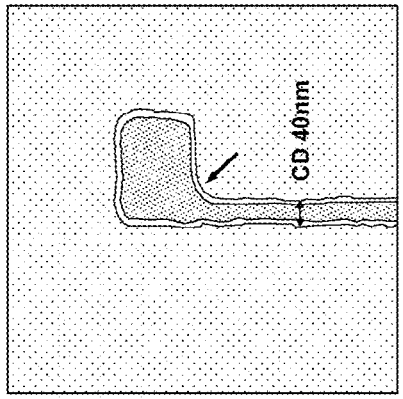
Figure 15A:
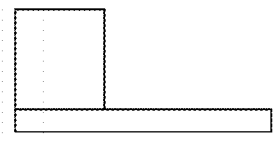
Figure 16D:
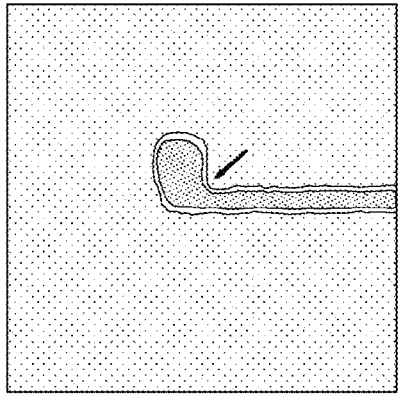
FIGS. 16a, 16b, 16c and 16d illustrate an exemplary embodiment of the invention of a technique of extrusion of a correction pattern by comparison with a realization of the exposure without extrusion, for a seventh particular type of pattern to be etched.
Figure 16C:
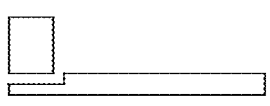
Figure 16B:
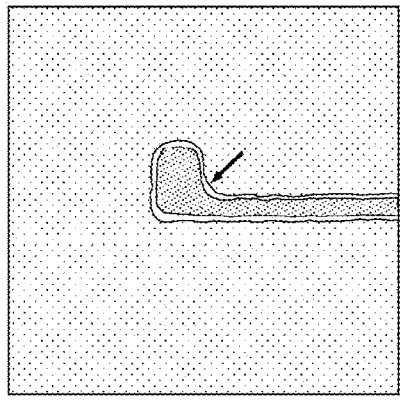
Figure 16A:
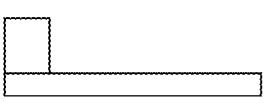

It is also seen by comparing the two photos of FIG. 15d that the re-entrant corner exhibits a much weaker rounding. The imperfections which remain, such as the upper left corner of the pattern may be corrected by applying an eRIF function The scheme of the invention has been described in an exemplary application to a method of electron-beam lithography by direct writing. It can also be applied to another method of electron-beam lithography using masks.

The examples described hereinabove are therefore given by way of illustration of certain embodiments of the invention. They do not in any way limit the field of the invention which is defined by the claims which follow.

The invention claimed is:

1. A method of electron-beam lithography of networks of patterns on a resin coated substrate including at least two contiguous patterns perpendicular to each other, the method comprising:
   a step of determining said at least two contiguous patterns,
   a step of generating at least one correction pattern including a non-exposure zone of the resin cutting through at least one of said at least two contiguous patterns around a common edge of said at least two contiguous patterns, and
   a step of combining said at least one correction pattern with said at least two contiguous patterns,
   wherein said at least two contiguous patterns are no longer contiguous after said step of combining.

2. The lithography method as claimed in claim 1, wherein a critical dimension of the networks of patterns is of an order of 35 nm and said non-exposure zone of the resin produces a spacing between said at least two contiguous patterns of the order of 10 nm.

3. The lithography method as claimed in claim 1, wherein said correction pattern determines an exposure zone of the resin added in a contiguous manner to at least one of said at least two contiguous patterns.

4. The lithography method as claimed in claim 3, wherein the critical dimension of the networks of patterns is of the order of 35 nm, and said exposure zone of the resin produces a lengthening of said at least one of the at least two contiguous patterns in a larger dimension of the at least two contiguous patterns of the order of 5 nm.

5. The lithography method as claimed in claim 1, wherein said correction patterns, dimensions and locations of the connection patterns are determined by a model for automatically determining a target design comprising the at least two contiguous patterns and the correction patterns.

6. The lithography method as claimed in claim 1, further comprising:
   at least one step of calculating at least one dimension of at least one of the at least two contiguous patterns, and
   a step of calculating modulation of doses on said at least two contiguous patterns, said steps of calculating being linked by a functional relation involving a process energy latitude.

7. The lithography method as claimed in claim 1, wherein the step of combining said correction pattern with said at least two contiguous patterns uses a function for negative rescaling of the non-exposure zone.

8. The lithography method as claimed in claim 1, wherein the step of generating at least one correction pattern uses an eRIF function.

9. A method of electron-beam lithography of networks of patterns on a resin coated substrate including at least two rectilinear patterns positioned in a contiguous manner having respective rectilinear directions perpendicular to one another, comprising:
   a step of determining said at least two rectilinear patterns positioned in a contiguous manner having respective rectilinear directions perpendicular to one another,
   a step of generating at least one correction pattern including a non-exposure zone of the resin cutting through at least one of said at least two rectilinear patterns around a common edge of said at least two rectilinear patterns, and
   a step of combining said correction pattern with said at least two rectilinear patterns,
   wherein said correction pattern extends in one dimension of one of said at least two rectilinear patterns after said step of combining.

10. The lithography method as claimed in claim 9, wherein a critical dimension of the networks of patterns is of an order of 35 nm and said non-exposure zone of the resin produces a spacing between said at least two rectilinear patterns of the order of 10 nm.

11. The lithography method as claimed in claim 9, wherein said correction pattern determines an exposure zone of the resin added in a contiguous manner to at least one of said at least two rectilinear patterns.

12. The lithography method as claimed in claim 11, wherein the critical dimension of the networks of patterns is of the order of 35 nm, and said exposure zone of the resin produces a lengthening of said at least one of the at least two rectilinear patterns in a larger dimension of the at least two rectilinear patterns of the order of 5 nm.

13. The lithography method as claimed in claim 9, wherein said correction patterns, dimensions and locations of the connection patterns are determined by a model for automatically determining a target design comprising the at least two rectilinear patterns and the correction patterns.

14. The lithography method as claimed in claim 9, further comprising:
   at least one step of calculating at least one dimension of at least one of the at least two rectilinear patterns, and
   a step of calculating modulation of doses on said patterns, said steps of calculating being linked by a functional relation involving a process energy latitude.

* * * * *